(12) United States Patent
Park et al.

(10) Patent No.: US 7,416,758 B2
(45) Date of Patent: Aug. 26, 2008

(54) SLIT COATER

(75) Inventors: Jeong Kweon Park, Gyeongsangbuk-Do (KR); Jun Kyu Lee, Gyeonggi-Do (KR); Tai Hyun Lim, Gyeonggi-Do (KR); Seong Kwon, Gyeonggi-Do (KR)

(73) Assignee: LG Display Co., Ltd., Seoul (KR)

( * ) Notice: Subject to any disclaimer, the term of this patent is extended or adjusted under 35 U.S.C. 154(b) by 19 days.

(21) Appl. No.: 11/211,215

(22) Filed: Aug. 19, 2005

(65) Prior Publication Data

US 2006/0147621 A1 Jul. 6, 2006

(30) Foreign Application Priority Data

Dec. 31, 2004 (KR) ........................ 10-2004-0118441

(51) Int. Cl.
*B05D 5/06* (2006.01)
(52) U.S. Cl. .................... 427/58; 427/427.3; 118/323
(58) Field of Classification Search ................ 118/323; 427/64, 427.3
See application file for complete search history.

(56) References Cited

U.S. PATENT DOCUMENTS

| | | | | |
|---|---|---|---|---|
| 4,661,368 | A | * | 4/1987 | Rohde et al. .................... 427/8 |
| 5,167,837 | A | | 12/1992 | Snodgrass et al. |
| 5,540,779 | A | * | 7/1996 | Andris et al. ................ 118/692 |
| 5,829,689 | A | * | 11/1998 | Tadao et al. .................. 239/750 |
| 6,010,570 | A | * | 1/2000 | Motoda et al. ............... 118/323 |
| 6,129,040 | A | * | 10/2000 | Viggiano et al. ............. 118/323 |
| 6,319,323 | B1 | | 11/2001 | Gibson et al. |
| 6,475,282 | B1 | | 11/2002 | Snodgrass et al. |
| 6,488,041 | B1 | | 12/2002 | Gibson et al. |
| 6,540,833 | B1 | | 4/2003 | Gibson et al. |
| 6,548,115 | B1 | | 4/2003 | Gibson et al. |
| 2003/0183167 | A1 | * | 10/2003 | Kitazawa et al. ............. 118/323 |
| 2004/0135947 | A1 | * | 7/2004 | Jang et al. ................... 349/114 |
| 2004/0151993 | A1 | * | 8/2004 | Hasegawa et al. .............. 430/5 |
| 2004/0161975 | A1 | * | 8/2004 | Sakai et al. ................. 439/620 |

FOREIGN PATENT DOCUMENTS

| | | |
|---|---|---|
| JP | 64-032680 | 2/1989 |
| JP | 01-164474 | 6/1989 |
| JP | 07-326564 | 2/1995 |
| JP | 07-080385 | 3/1995 |
| JP | 07-171479 | 7/1995 |
| JP | 07-185434 | 7/1995 |
| JP | 07-185437 | 7/1995 |
| JP | 08-150359 | 6/1996 |

(Continued)

*Primary Examiner*—Timothy Meeks
*Assistant Examiner*—James Lin
(74) *Attorney, Agent, or Firm*—Brinks Hofer Gilson & Lione

(57) ABSTRACT

A slit coater including buffer members having elasticity and installed at both sides of a slit nozzle unit, compensating for a height difference between both sides, preventing breakdown due to excessive stress generated by the height, and reducing set-up time. The slit coater includes: a table on which an object to be processed is mounted; a slit nozzle unit formed above the table for applying coating solution onto the object; a driving unit moving the slit nozzle unit in a predetermined direction; and buffer members having elasticity installed at both sides of the slit nozzle unit.

10 Claims, 6 Drawing Sheets

FOREIGN PATENT DOCUMENTS

| | | |
|---|---|---|
| JP | 08-155365 | 6/1996 |
| JP | 08-173878 | 7/1996 |
| JP | 09-131561 | 5/1997 |
| JP | 09-164357 | 6/1997 |
| JP | 09-192566 | 7/1997 |
| JP | 09-206652 | 8/1997 |
| JP | 09-237748 | 9/1997 |
| JP | 09-271705 | 10/1997 |
| JP | 09-330876 | 12/1997 |
| JP | 10-156255 | 6/1998 |
| JP | 10-308338 | 11/1998 |
| JP | 11-154641 | 6/1999 |
| JP | 11-274071 | 10/1999 |
| JP | 2000-135463 | 5/2000 |
| JP | 2000-167469 | 6/2000 |
| JP | 2000-288488 | 10/2000 |
| JP | 2001-103202 | 4/2001 |
| JP | 2001-310147 | 11/2001 |
| JP | 2001-310152 | 11/2001 |
| JP | 2002-015664 | 1/2002 |
| JP | 2002-066432 | 3/2002 |
| JP | 2002-066487 | 3/2002 |
| JP | 2002-113411 | 4/2002 |
| JP | 2002-204996 | 7/2002 |
| JP | 2002-282760 | 10/2002 |
| JP | 2002-346453 | 12/2002 |
| JP | 2003-093944 | 4/2003 |
| JP | 2003-236435 | 8/2003 |
| JP | 2003-245591 | 9/2003 |
| KP | 1019940000157 | 1/1994 |
| KP | 1019950030213 | 11/1995 |
| KP | 101996005857 | 2/1996 |
| KP | 101996021170 | 7/1996 |
| KP | 1019970701099 | 3/1997 |
| KP | 1019970051813 | 7/1997 |
| KP | 1019970063518 | 9/1997 |
| KP | 1019970072019 | 11/1997 |
| KP | 101998063704 | 10/1998 |
| KP | 1019980087322 | 12/1998 |
| KP | 101999029827 | 4/1999 |
| KP | 1020010006575 A | 1/2001 |
| KP | 1020010086065 | 7/2001 |
| KP | 1020020018973 A | 3/2002 |
| KP | 1020020019406 A | 3/2002 |
| KP | 1020020028829 A | 4/2002 |
| KP | 1020020029323 A | 4/2002 |
| KP | 1020020077814 A | 10/2002 |
| KP | 1020020080440 | 10/2002 |
| KP | 1020030003114 A | 1/2003 |
| KP | 1020030011462 A | 2/2003 |
| KP | 1020030011463 A | 2/2003 |
| KP | 1020030045636 A | 6/2003 |
| KR | 20020018974 | 3/2002 |

* cited by examiner

SLIT COATER

PRIORITY CLAIM

This application claims priority to Korean patent application No. 118441/2004 filed Dec. 31, 2004 the disclosure of which is incorporated by reference herein.

TECHNICAL FIELD

The present invention relates, generally, to a slit coater and more particularly, to a slit coater capable of supplying a coating solution such as a photosensitive solution, a development solution, a color filter, or the like, to an object to be processed such as the substrate of a flat panel display (FPD) or a semiconductor wafer.

BACKGROUND

When a flat panel display device or a semiconductor device is fabricated, a process for depositing a thin film, a photolithography process for exposing a region selected in the thin film, and an etching process for removing the thin film of the selected region are performed several times. Particularly, the photolithography process includes a coating process for forming a photosensitive film of photosensitive solution such as a photoresist on a substrate or a wafer, and an exposing and developing process for patterning the photosensitive film by using a mask with a predetermined pattern.

In general, a spray coating method, a roll coating method, a spin coating method, or the like, is used in the coating process for forming a photosensitive film on a substrate and a wafer.

Because the spray coating method and the roll coating method are not suitable to achieve high precision in the uniformity of a coating film and the adjustment of a thickness of the film, the spin coating method is used for high-precision pattern formation.

A spin coater used in the spin coating method will now be described in detail with reference to accompanying drawings.

FIG. 1 is a sectional view which illustrates the structure of a general spin coater.

As shown, the spin coater includes a spin chuck 5 that is connected to a rotating shaft 6. A cover 7 surrounds the spin chuck 5 and may be opened and closed. A nozzle 4 is placed above the spin chuck 5 and moves into the cover 7 when the cover 7 is opened.

An object 10 to be processed and coated with a photosensitive film is mounted on the spin chuck 5, and a drain valve (not shown) for discharging photosensitive solution, such as photoresist, to the outside is installed at a lower portion of the cover 7.

In order to form a coating film on the predetermined object 10, first, the nozzle 4 of the spin coater having the aforementioned structure is lowered and sprays photosensitive solution onto a surface of the object 10, which has been placed on the spin chuck 5.

When the photosensitive solution is sprayed onto the object 10, the cover 7 is hermetically closed, a motor (M) is rotated, and the rotating shaft 6 connected thereto is rotated, thereby rotating the spin chuck 5 with the object 10 a certain number of times.

When the spin chuck 5 is rotated, the photosensitive solution on the surface of the object 10 is spread out by a centrifugal force, thereby applying the photosensitive solution over an entire surface of the object 10.

After the photosensitive solution is applied over the entire surface of the object 10, the applied photosensitive solution is hardened. Then, a predetermined pattern is formed on the surface of the object 10 through exposure and development using a photo mask or the like.

Although the spin coating method using the spin coater is suitable to coat a small object such as a wafer with a photosensitive film, it is not suitable to coat a large and heavy substrate, such as a flat panel display device having a glass substrate for a liquid crystal display panel with a photosensitive film.

This is because it gets harder to rotate a substrate at a high speed as the substrate gets larger and heavier. Further, damage to the substrate can occur and a lot of energy is consumed when the substrate is rotated at a high speed.

Also, the spin coating method is disadvantageous in that a large amount of photosensitive solution is wasted in comparison with the amount of photosensitive solution used in the photolithography process. In particular, a considerable amount of photosensitive solution is dispersed outside the spin chuck at the time of high-speed rotation, and is wasted. Substantially, the amount of wasted solution is much larger than the amount of solution used for coating, and the dispersed photosensitive solution may form particles that contaminate following thin film forming processes. The particles can also cause environmental pollution.

BRIEF SUMMARY

In accordance with the present invention, there is provided a slit coater including a table to which an object to be processed is mounted; a slit nozzle unit configured to apply a coating solution onto a surface of the object; a driving unit configured to move the slit nozzle unit in a predetermined direction; and an elastic buffer member installed at both sides of the slit nozzle unit.

In accordance with another aspect of the invention, a method for fabricating an LCD device includes applying a coating solution onto a surface of an LCD substrate using a slit nozzle unit, and adjusting the height of the slit nozzle unit using at least one elastic buffer member coupled to the slit nozzle unit.

In accordance with yet another aspect of the invention, a method for fabricating an LCD device includes moving a slit nozzle over a substrate, applying a coating solution to the substrate from the slit nozzle, and elastically buffering the movement of the slit nozzle from at least one buffer member coupled with the slit nozzle.

The foregoing and other features, aspects and advantages of the present invention will become more apparent from the following detailed description of the present invention when taken in conjunction with the accompanying drawings.

BRIEF DESCRIPTION OF THE DRAWINGS

The accompanying drawings, which are included to provide a further understanding of the invention and are incorporated in and constitute a unit of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

In general, as mentioned above, a photolithography process is required in the field of semiconductor manufacture and the field of flat panel display device in order to pattern a thin film performing a specific function, for example, an insulation film, a metal thin film, a semiconductor thin film or the like, into a desired form. Here, photosensitive solution such as photoresist, which chemically reacts to light, is used in the photolithography process.

A photosensitive film having a uniform thickness should be formed on a substrate on which a thin film has been formed, so that a defect does not occur during the process. For example, if the photosensitive film has a thickness greater than a designated thickness, a portion of the thin film which should be etched is not etched, and if the photosensitive film has a thickness smaller than the designated thickness, the thin film is excessively etched. The uniform application of the photosensitive solution has become one of the most important issues as substrates become larger due to an increase in size of the liquid crystal display panel of a liquid crystal display (LCD) device.

In accordance with an embodiment of the invention, a nozzle method in which a uniform amount of photosensitive solution is applied by using a slit nozzle, rather than a spinner as in the related art. A coating apparatus employing such a nozzle method is referred to as a spinless coater because a spinner is not used. Alternately, the term "slit coater" is used because photosensitive solution is applied through a slit. The slit coater supplies the photosensitive solution through a nozzle having a slit shape with a length longer than its width, and applies the photosensitive solution onto a surface of a substrate in a plane form, which makes the slit coater suitable to apply the photosensitive solution to a large LCD device.

Figure 1:
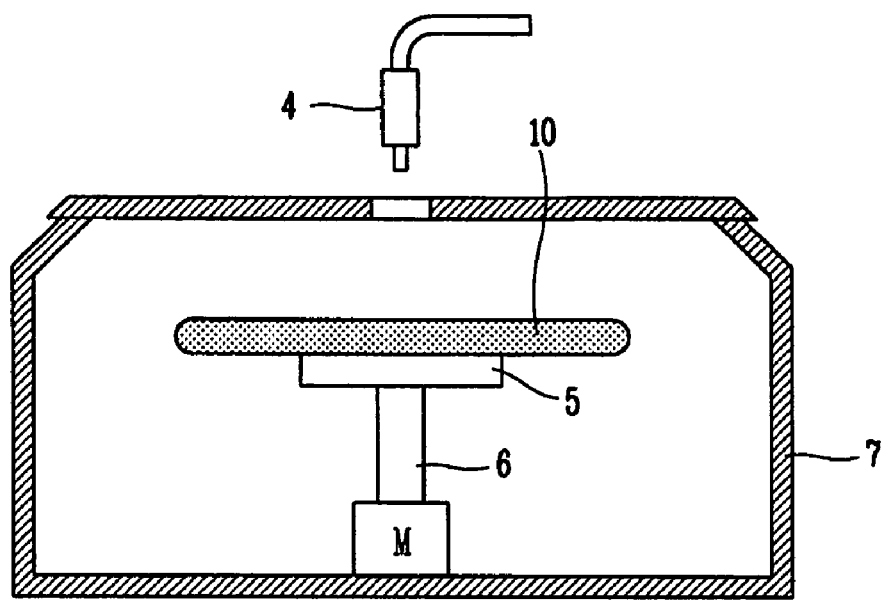
FIG. 1 is a sectional view which illustrates a structure of a related art spin coater.
Figure 2A:
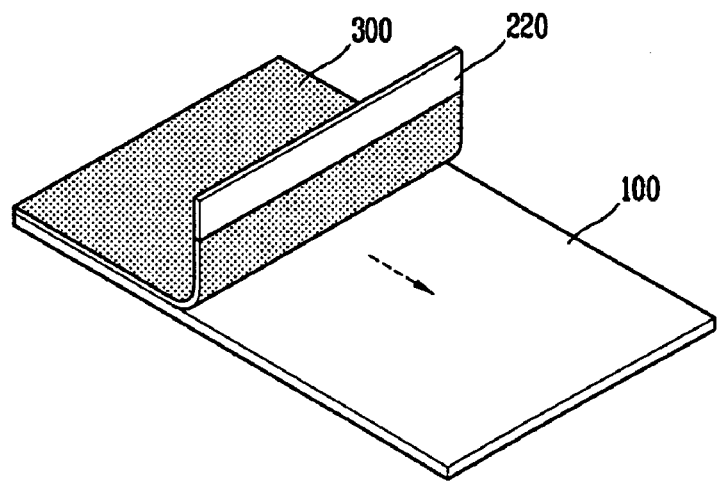
FIGS. 2A and 2B are perspective views which illustrate a slit coater and application of photosensitive solution by the slit coater in accordance with an embodiment of the invention.
Figure 2B:
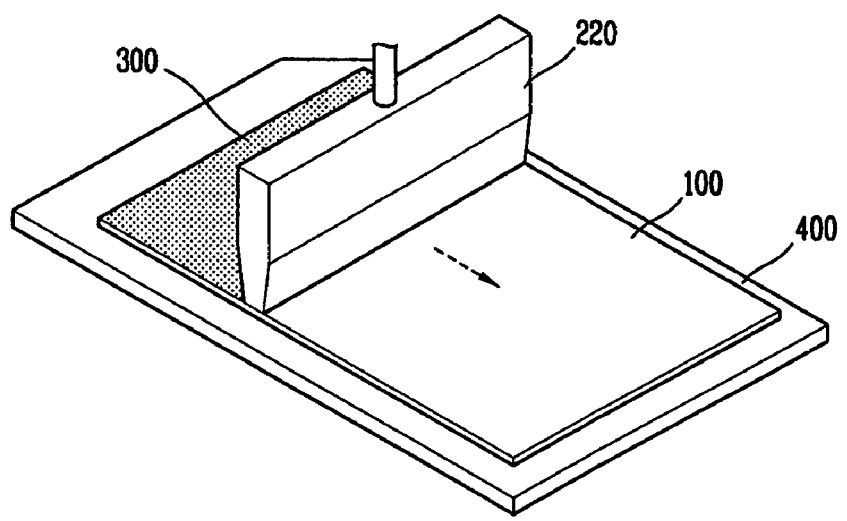

FIGS. 2A and 2B are exemplary views which illustrate a slit coater and the application of the photosensitive solution by the slit coater. In accordance with an embodiment of the invention, the slit coater is provided with a slit nozzle 220 having a narrow and long slit. Photosensitive solution 300 is supplied through the slit nozzle 220, thereby applying the photosensitive solution 300 on a surface of a substrate 100 in a plane form.

The slit coater is an apparatus that applies a predetermined amount of photosensitive solution 300 onto the substrate 100 or the like through a bar-shaped long slit nozzle 220. The slit coater applies a uniform amount of photosensitive solution 300 through a fine slit nozzle 220, moving from one side to the other side of the substrate 100 at a constant speed, thereby forming a uniform photosensitive film on the surface of the substrate 100.

Also, because the slit coater may apply the photosensitive solution 300 only to a desired surface of the substrate 100, the coating solution may be used without being wasted as compared with the aforementioned spin coater of the related art. In addition, because the slit coater may apply the coating solution in a plane form with a long width, it is suitable for a large substrate or a quadrangular substrate.

For reference, element 400 indicates a table on which the substrate 100 is mounted, and the arrow indicates a direction in which the photosensitive solution 300 is applied along the direction that the slit nozzle 220 moves.

In a slit coater in accordance with the present invention, a slit nozzle unit may move smoothly in the direction of the Z-axis, namely, in a vertical direction by buffer members having elasticity and installed at both sides of the slit nozzle unit, thereby solving disadvantages such as a limited coating method due to stiff structure design, breakdown caused by excessive stress generated by the height difference between both sides, and long set-up time.

Figure 3:
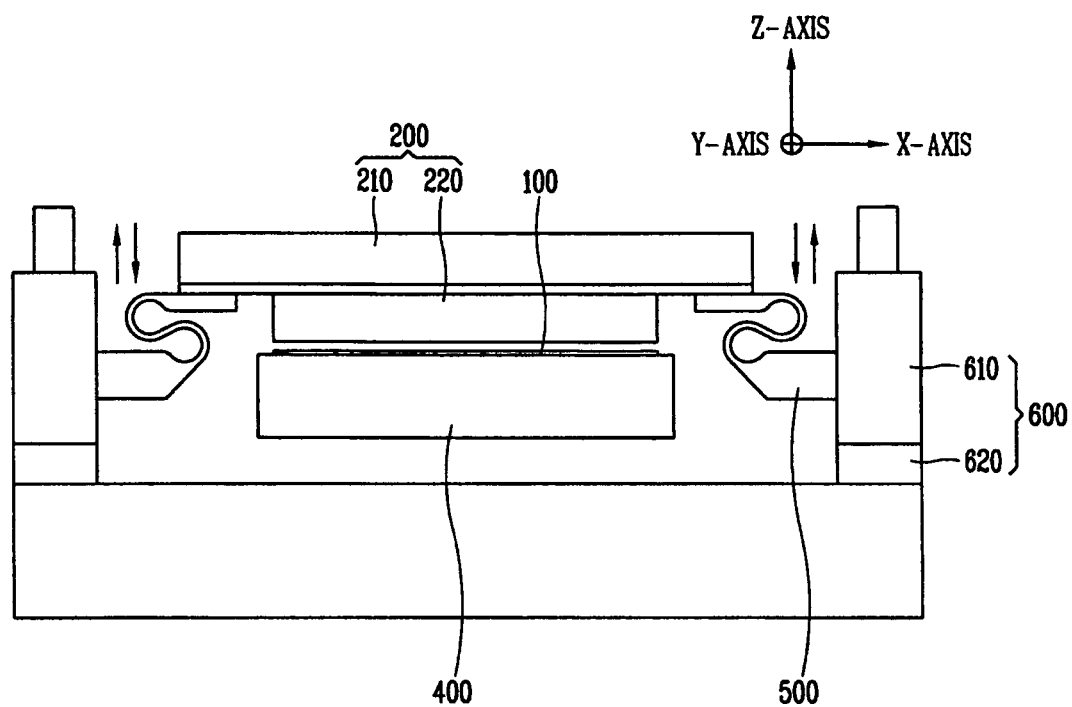
FIG. 3 is a schematic front view which illustrates a slit coater having a buffer member in accordance with an embodiment of the present invention.

FIG. 3 is a schematic front view of the slit coater having buffer members in accordance with an embodiment of the present invention.

As shown, the slit coater in accordance with the present embodiment includes a table 400 on which a substrate 100 is mounted, a slit nozzle unit 200 configured to apply a coating solution, such as a photosensitive solution, on the substrate 100, and a driving unit 600 installed at both sides of the slit nozzle unit 200 and moving the slit nozzle unit at a constant speed. Also, the slit coater may include a supply unit (not shown) supplying photosensitive solution to be applied to the substrate 100, and a pumping unit (not shown) allowing the photosensitive solution to be applied, applying constant pressure to the photosensitive solution being supplied to the slit nozzle 200 from the supply unit.

Although not shown in the drawing, the supply unit may include a storage tank storing photosensitive solution, a supply line supplying the photosensitive solution stored therein to the slit nozzle unit 200, and a flow rate control apparatus.

The storage tank stores coating solution supplied to the slit nozzle unit 200, such as photosensitive solution like photoresist, development solution and a color filter, and may be attached to the driving unit 600. Also, the pumping unit applies constant pressure to the slit nozzle unit 200 and allows photosensitive solution stored in the slit nozzle unit 200 to be applied by the pressure.

Also, the pumping unit may be installed at the storage tank, and is configured to supply coating solution stored in the storage tank to the slit nozzle unit 200 by pressurizing the inside of the storage tank.

The driving unit 600 includes a pair of Z-axial driving apparatuses 610 installed at both sides of the slit nozzle unit 200 and moving the slit nozzle unit 200 in a vertical direction (the direction of the Z-axis), and a pair of Y-axial driving apparatuses 620 moving the slit nozzle unit 200 at a constant speed in the direction of the Y-axis to uniformly apply the photosensitive solution onto the surface of the substrate 100.

Here, each of the Y-axial driving apparatuses 620 may include a motor (not shown) and a transfer unit (not shown) such as a transfer rail and a guide rail, and a non-contact type linear motor may be used as the motor.

An object 100 to be processed such as a glass substrate is mounted on the table 400, and a plurality of pins (not shown) for lifting up the substrate 100 from the table 400 are installed inside the table 400.

The slit nozzle unit 200 includes a nozzle 220 formed above the substrate 100 and across the substrate 100 and having a slit shape with a length corresponding to the width of the substrate 100, and a head 210 to which the nozzle 220 is mounted.

Although not shown in the drawing, the nozzle 220 includes a nozzle body, an inlet and an outlet, wherein the nozzle body has therein a receiving space for storing photosensitive solution. The inlet is formed at the nozzle body, and the outlet is formed on a lower portion of the nozzle body, which faces the substrate 100. In this case, the outlet has a slit shape with a length longer than its width.

Also, the nozzle 220 applies the photosensitive solution, while moving from one side to the other side of the substrate 100 through the Y-axial driving apparatuses 620, thereby uniformly applying the photosensitive solution onto the surface of the substrate 100. The photosensitive solution may be applied by sliding the substrate 100 relative to the nozzle 220, which remains in a fixed position.

The slit coater in accordance with the present embodiment is provided with buffer members 500 having elasticity and installed at both sides of the slit nozzle unit 200 as shown in the drawing, so that the height difference between both ends of the nozzle 220 in the vertical Z-direction may be freely adjusted.

Specifically, if an excessive height difference between both ends of the nozzle 220 in the vertical Z-direction occurs from the impact of the driving of the slit nozzle unit 200 at the moment of the initiation of the driving, the buffer members 500 of the present embodiment absorb the impact and compensate for the height difference. Accordingly, breakdown caused by the excessive stress generated by a height difference can be prevented. As a result, the glass substrate, or an object to be processed, and the expensive slit coater equipment may be properly protected.

Alternatively, the buffer members 500 may incline the head 210 to which the nozzle 220 is mounted at various angles, thereby desirably allowing coating to be made at various angles and also allowing nozzles 220, which have various interiors according to the position of a vent, to be mounted. Also, because both sides of the head 210 are controlled to be in different positions in the direction of the Z-axis when the coating is made, the coating may be made from various positions. Specifically, with the buffer members 500 at both sides of the slit nozzle unit 200, the slit coater in accordance with the present embodiment may independently control the pair of Z-axial driving apparatuses 610, so that the head 210 of the slit nozzle unit 200 may be inclined at various angles and both sides of the head 210 are at different positions in the direction of the Z-axis. Therefore, the coating may be made from various positions.

The slit coater having the buffer members 500 of the present embodiment may adjust the height difference by an angle of about 0~60° when the slit nozzle unit 200 moves up and down.

The buffer members 500 of the present embodiment may be formed as an S shape having elasticity, and where its thickness and length may be varied according to the load of the slit nozzle unit 200.

Figure 4A:
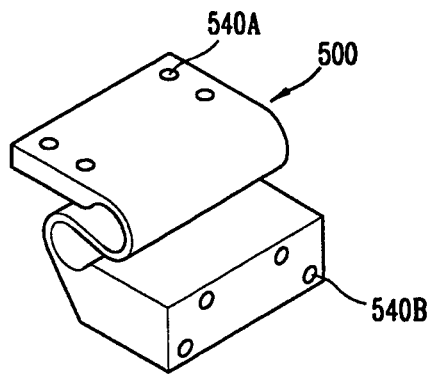
FIGS. 4A to 4C are enlarged exemplary views of the buffer members illustrated in FIG. 3.
Figure 4B:
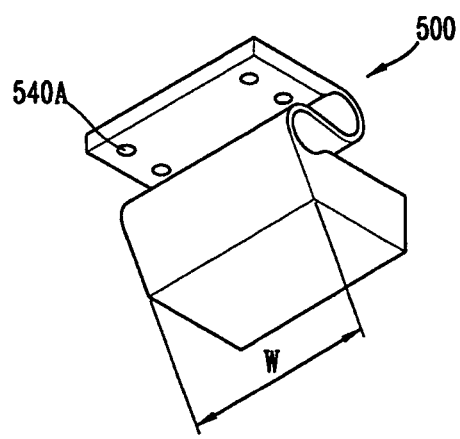
Figure 4C:
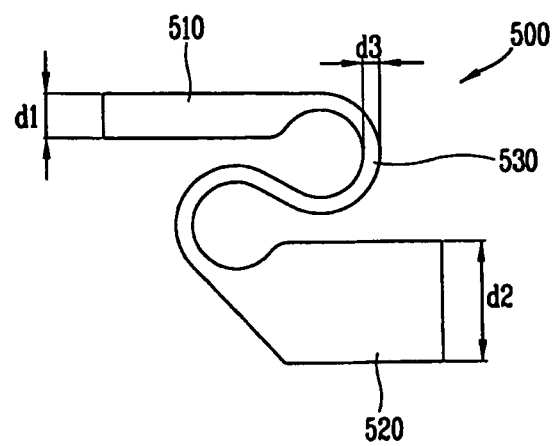

FIGS. 4A to 4C are enlarged exemplary views of the buffer members 500 shown in FIG. 3. Specifically, FIGS. 4A to 4C are perspective views and a sectional view which illustrate an exemplary shape of the buffer members 500.

Although buffer members 500 having a reversed S shape by being bent twice is taken as an example in the drawing, the present invention is not limited thereby and any buffer member may be used regardless of its shape and regardless of the number of times the buffer member is bent, as long as it retains its elasticity.

As shown in FIG. 4B, the buffer member 500 in accordance with the present embodiment has a reversed S shape with a predetermined width (w), and includes a first coupling portion 510 coupled to one side of the head 210 of the slit nozzle unit 200, a second coupling portion 520 coupled to a predetermined region of the driving unit 600 and a buffer portion 530 formed between the first coupling portion 510 and second coupling portion 520 that operates as a buffer.

The first coupling portion 510 has a first connecting portion 540A as in FIGS. 4A and 4B. The first connecting portion 540A may be a screw hole that couples the buffer member 500 to the head 210 of the slit nozzle unit 200. The second coupling portion 520 has a second connecting portion 540B as in FIG. 4A, at its side surface so as to couple the buffer member 500 to the driving unit 600.

The buffer portion 530 in FIG. 4C has a reversed S shape or an S shape by being bent (curved) once at the first coupling portion 510 and bent again toward the second coupling portion 520. However, as mentioned above, the number times the buffer portion 530 is bent or the angle at which the buffer portion 530 is bent is not significant and the buffer portion 530 could comprise any number of bends at any number of angles as long as the buffer member 500 retains its elasticity.

The first coupling portion 510 has a first thickness (d1), the second coupling portion 520 has a second thickness (d2), and the buffer portion 530 has a third thickness (d3). Although the embodiment where the first coupling portion 510, the second coupling portion 520 and the buffer portion 530 have different thicknesses (d1~d3) is taken as an example in the drawing, the present invention is not limited thereby and any of the first coupling portion 510, the second coupling portion 520 or the buffer portion 530 may have the same thickness (d1~d3).

In order to effectively support a load of the slit nozzle unit 200, the second thickness (d2) of the second coupling portion 520 may be greater than the first thickness (d1) of the first coupling portion 510.

Also, as mentioned above, the width (w), the thicknesses (d1~d3) and the length of the buffer member 500 may be varied depending upon the load of the slit nozzle unit, the desired height difference and the vibration limit.

In the slit coater according to the present embodiment, the buffer members 500 are provided at both sides of the slit nozzle unit 200, so as to incline the head 210 at various angles. Thus, coating may be made at various angles and may be made such that both sides of the head 210 are in different positions in the direction of the Z-axis during the process.

The buffer member 500 in accordance with the present embodiment allows the nozzle to smoothly move in the direction of the Z-axis, namely, in the vertical direction, so that breakdown due to excessive stress generated by the height difference between both sides according to a stiff structure design may be prevented.

When the slit nozzle unit 200 is initially mounted and the slit coater is set-up, or when the slit nozzle unit 200 is separated due to damage, replacement or the like, and then re-mounted, the buffer member 500 distributes the load. Thus, assembly may be made in a state where the vertical positions of both sides of the slit nozzle 220 are not accurately set up at the time of assembly. Comparatively, in the related art, if the vertical positions of the slit nozzle are not accurately set up, a load is concentrated on one side of the slit nozzle and accordingly, the slit nozzle unit and the head to which the slit nozzle unit is mounted are damaged. For this reason, in the related art, the vertical positions of both sides of the slit nozzle should be accurately set up. Also, because the vertical positions of both sides of the slit nozzle 220 may be set up later on, the set-up time is desirably reduced.

Because the slit coater in accordance with the present embodiment can operate while both sides of the head 210 are in different positions in the direction of the Z-axis, nozzles 220 having various internal shapes depending upon the position of a vent may be used. This will now be described in detail with reference to accompanying drawings.

Figure 5:
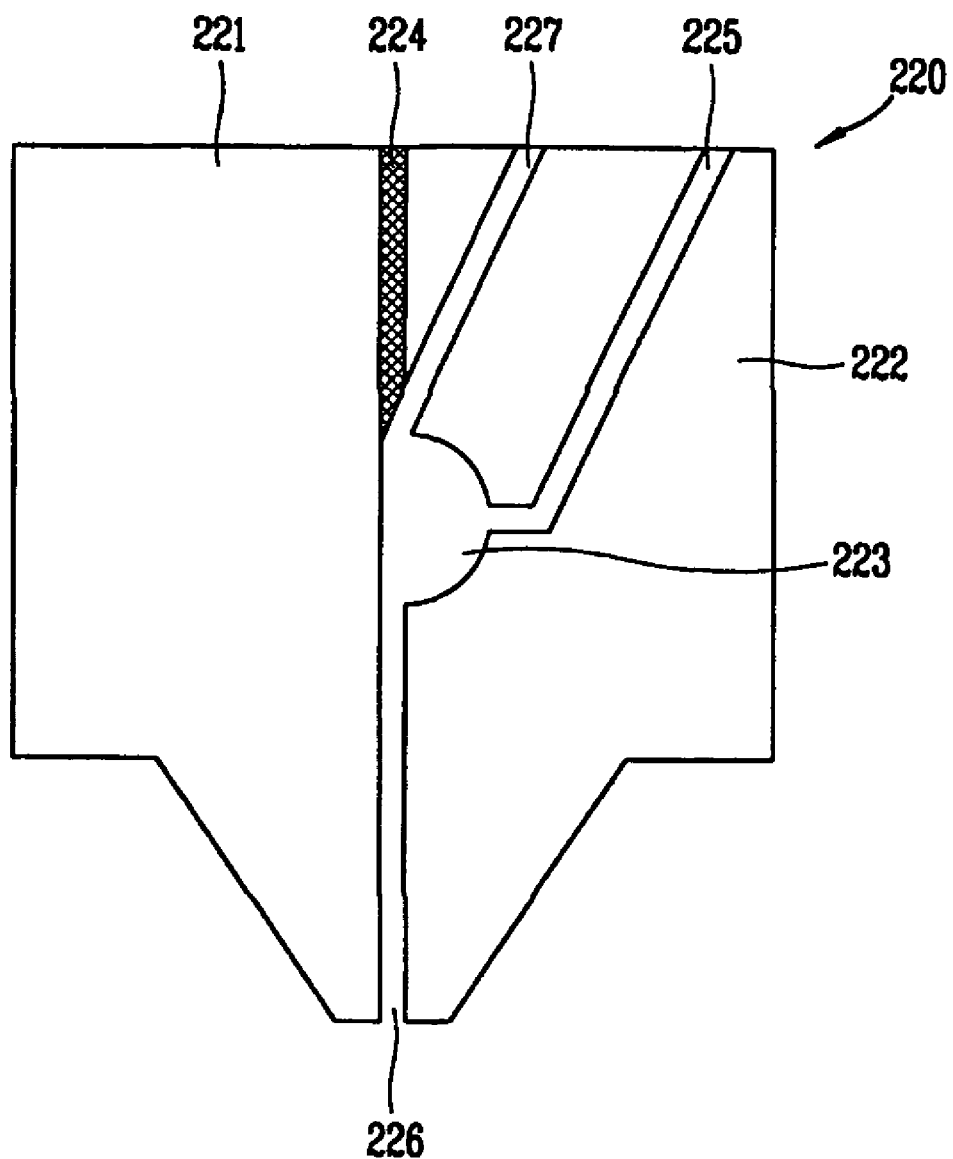
FIG. 5 is an enlarged sectional view which illustrates the nozzle illustrated in FIG. 3.

FIG. 5 is an enlarged sectional view of a nozzle shown in FIG. 3.

As shown, the nozzle 220 includes a first nozzle body 221, a second nozzle body 222, an inlet 225, a vent 227, and an outlet 226.

The nozzle 220 has a structure such that two nozzle bodies 221 and 222 are coupled, and a receiving space 223 is formed between the first nozzle body 221 and the second nozzle body 222. The receiving space 223 temporarily stores a certain amount of photosensitive solution for the purpose of uniform application of the photosensitive solution being pressurized by a pumping unit.

The inlet 225 is formed at an upper portion of the second nozzle body 222 and supplies the photosensitive solution to the receiving space 223. The outlet 226 has a slit shape with a length longer than its width, is formed at a lower portion of the nozzle bodies 221 and 222 facing the substrate 100, and applies the photosensitive solution onto the surface of the substrate 100 in a plane form.

A gap between the first nozzle body 221 and the second nozzle body 222 is determined and maintained by a very thin shim 224. The shim 224 may be made of stainless steel in one embodiment.

Figure 6A:
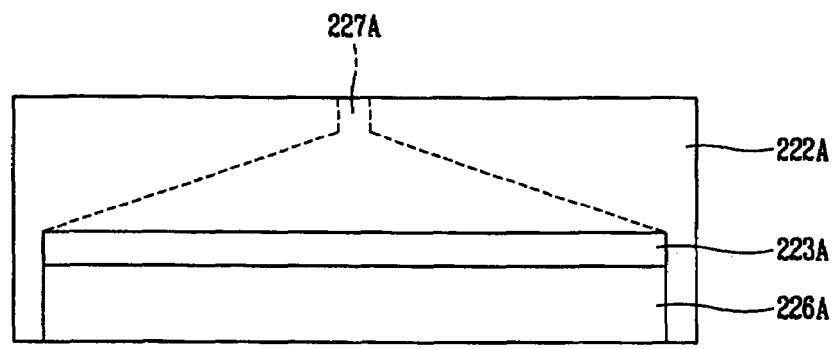
FIGS. 6A to 6C are sectional views which illustrate various interiors of the nozzle according to the position of a vent.
Figure 6B:
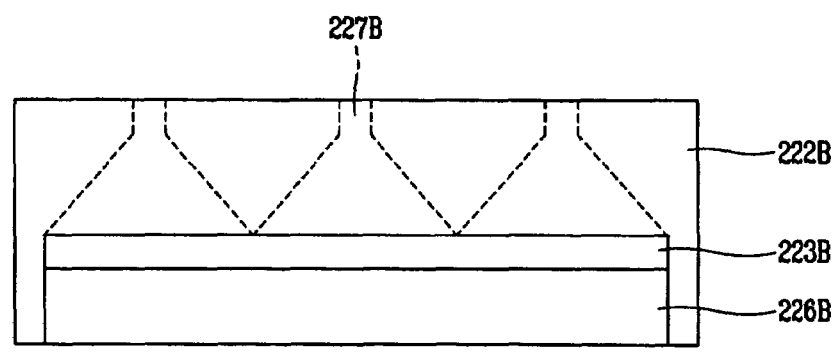
Figure 6C:
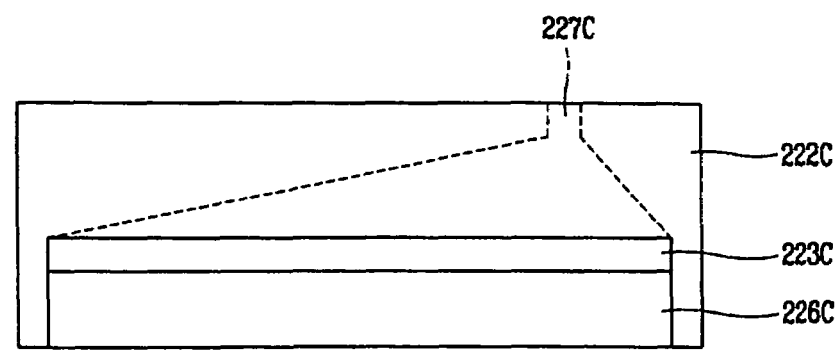

FIGS. 6A to 6C are sectional views which illustrate the interiors of the nozzles with various internal shapes. Specifically illustrated are the interiors of the second nozzle body 222 with various internal shapes according to the position of a vent.

Here, FIG. 6A illustrates an embodiment where a vent 227A is formed at the center of the second nozzle body 222A, FIG. 6B illustrates the case where vents 227B are formed at the center, right, and left sides of the second nozzle body 222B, and FIG. 6C illustrates the case where vent 227C is inclined toward one side of the second nozzle body 222C.

As shown, each of the second nozzle bodies (222A~222C) includes an inlet (not shown), a receiving space (223A~223C) and an outlet (226A~226C). Vents 227A~227C in various positions are formed at upper portions of the second nozzle bodies 222A~222C, respectively. Each of the vents 227A~227C is formed to discharge the air when the air is generated in the receiving space (223A~223C) as in the case where the photosensitive solution is initially filled in each of the receiving spaces (223A~223C).

As mentioned above, the vents 227A~227C are formed at various positions. If the vent 227C is inclined toward one side of the second nozzle body 222C as shown in FIG. 6C, the nozzle 220 should be inclined at a predetermined angle in order to discharge the air by using the vent 227C. As described above, because the buffer member 500 in accordance with the present invention may control both sides of the head to be in different positions in the direction of the Z-axis, various nozzles having various internal shapes according to the position of the vent may be freely mounted and used.

As the present invention may be embodied in several forms without departing from the spirit or essential characteristics thereof, it should also be understood that the above-described embodiments are not limited by any of the details of the foregoing description, but rather should be construed broadly within its spirit and scope as defined in the appended claims, and therefore all changes and modifications that fall within the metes and bounds of the claims, or equivalents of such metes and bounds are therefore intended to be embraced by the appended claims.

What is claimed is:

1. A method for fabricating an LCD device comprising:
   applying a coating solution onto a surface of an LCD substrate using a slit nozzle unit; and
   while applying the coating solution, freely adjusting a height difference between both sides of the slit nozzle unit in a vertical (z-axial) direction using elastic buffer members coupled between the side of the slit nozzle unit and a driving unit having a pair of z-axial driving apparatuses installed at both ends of the slit nozzle unit,
   wherein during a vertical driving of the pair of z-axial driving apparatuses, the elastic buffer members compensate for the height difference.

2. The method of claim 1, wherein freely adjusting the height difference between both sides of the slit nozzle unit comprises using elastic buffer members coupled between the side of the slit nozzle unit and the driving unit configured to move the slit nozzle unit in a predetermined direction.

3. The method of claim 1 further comprising mounting the LCD substrate on a table in spaced relation with the slit nozzle unit.

4. The method of claim 1, wherein using the elastic buffer members comprises elastically buffering the vertical movement of the slit nozzle unit.

5. The method of claim 1, wherein applying a coating solution comprises applying one of a photosensitive solution, a development solution, or a color filter.

6. The method of claim 1, wherein using a slit nozzle unit comprises providing a nozzle having a long slit and a head to which the nozzle is mounted, wherein the length of the slit is longer than its width.

7. The method of claim 1, wherein using the buffer members comprises providing the buffer members with a first coupling portion coupled to one side of the slit nozzle unit, a second coupling portion coupled to a predetermined region of the driving unit, and a buffer portion formed between the first coupling portion and the second coupling portion.

8. The method of claim 7, wherein providing the buffer members with the first and second coupling portions comprises providing at least one bend between the first and second coupling portions.

9. The method of claim 7, wherein providing the buffer members with the first and second coupling portions comprises providing at least one of an S shape, a reversed S shape, or a combination thereof by creating a first bend at the first coupling portion and a second bend toward the second coupling portion.

10. The method of claim 1, further comprising providing at least one vent formed at an upper portion of the nozzle and configured to discharge air.

* * * * *